United States Patent [19]
Yang

[11] Patent Number: 5,478,760
[45] Date of Patent: Dec. 26, 1995

[54] PROCESS FOR FABRICATING A VERTICAL BIPOLAR JUNCTION TRANSISTOR

[75] Inventor: Sheng-Hsing Yang, Hsinchu, Taiwan

[73] Assignee: United Microelectronics Corp., Hsinchu, Taiwan

[21] Appl. No.: 410,759

[22] Filed: Mar. 27, 1995

[51] Int. Cl.[6] .................................................. H01L 21/265
[52] U.S. Cl. ........................... 437/31; 437/32; 437/141; 437/152; 437/917; 148/DIG. 10; 148/DIG 11; 148/DIG. 96; 257/526; 257/557; 257/559; 257/561; 257/565; 257/586
[58] Field of Search .............................. 437/31, 32, 141, 437/152, 917; 148/DIG. 10, DIG. 11, DIG. 96; 257/557, 561, 559, 526, 586, 565

[56] References Cited

U.S. PATENT DOCUMENTS

| | | | |
|---|---|---|---|
| 4,916,083 | 4/1990 | Monkowski et al. | 437/31 |
| 4,980,302 | 12/1990 | Shimizu | 437/31 |
| 5,057,443 | 10/1994 | Hutter | 437/31 |
| 5,387,553 | 2/1995 | Moksvold et al. | 437/32 |

*Primary Examiner*—Olik Chaudhuri
*Assistant Examiner*—Long Pham
*Attorney, Agent, or Firm*—Cushman Darby & Cushman

[57] ABSTRACT

A process for fabricating a bipolar junction transistor by forming a trench in a silicon substrate. A lightly-doped base region is formed adjacent to the sidewalls of the trench, and a heavily-doped base region is formed under the bottom of the trench. Silicon oxide layers are formed along the sidewalls and bottom of the trench with a contact window provided to expose part of the lightly-doped base region. A polysilicon layer is formed in the trench, and is heavily doped by a dopant which in turn diffuses into the lightly-doped base region through the contact window to form an emitter region. A collector region is formed in the upper surface of the lightly-doped base region.

7 Claims, 6 Drawing Sheets

PROCESS FOR FABRICATING A VERTICAL BIPOLAR JUNCTION TRANSISTOR

BACKGROUND OF THE INVENTION

1. Field of the Invention

The present invention relates to a vertical bipolar junction transistor (BJT), and more particularly to a process for fabricating a vertical bipolar junction transistor that has a higher switching speed than that of conventional vertical bipolar transistors.

2. Description of the Related Art

Vertical BJTs are well known in the integrated-circuit art. FIG. 1 (Prior Art) is a schematic cross section of a conventional vertical BJT. The vertical BJT is fabricated in an N-type silicon substrate 1, and includes a large $P^-$-type base region 12 formed in the silicon substrate 1, an $N^+$-type emitter region 10 formed in the base region 12, a $P^+$-type contact region 14 for the base region 12, and an $N^+$-type collector region 16 formed in the silicon substrate 1.

The size of the emitter region 10 of the conventional vertical BJT is relatively large, producing to large junction capacitance which lowers the switching speed. The distance from the emitter region 10 to the collector region 16 is relatively long, producing a large collector resistance which also lowers the switching speed.

SUMMARY OF THE INVENTION

The primary object of the present invention is to provide a process for fabricating a novel vertical bipolar junction transistor structure, which has a smaller emitter size and a smaller collector resistance to increase the switching speed.

In accordance with the present invention, a process for fabricating a bipolar junction transistor comprises the following steps:

providing a silicon substrate of a first conductivity type;

forming a shielding layer having an opening over the silicon substrate by deposition and etching;

implanting ions of a second conductivity type opposite to the first conductivity type into the silicon substrate through the opening to form a lightly-doped base region extending to the underside of the shielding layer by diffusion;

etching the silicon substrate to form a trench by using the shielding layer as a mask;

implanting ions of the second conductivity type into the silicon substrate through the trench to form a heavily-doped base region located under the bottom of the trench and extending to contact the lightly-doped base region by diffusion;

forming, by oxidation, a first oxide thin-layer at the sidewalls of the trench, and a second oxide thin-layer at the bottom of the trench;

forming a sidewall spacer at the lower corner of the trench;

forming, by oxidation, an isolation oxide thick-layer at the surfaces uncovered by the shielding layer and the sidewall spacer;

Removing the sidewall spacer, the shielding layer, and the first oxide thin-layer previously covered by the sidewall spacer in order to form a contact window in the trench;

forming, in the trench, a conductive layer heavily doped by a dopant of the first conductivity type, the dopant diffusing into the lightly-doped base region through the contact window to form an emitter region; and forming a collector region of the first conductivity type in the upper surface of the lightly-doped base region.

According to one aspect of the present invention, the conductive layer is made of polysilicon. The shielding layer and the sidewall spacer are made of silicon nitride. The thickness of the first oxide thin-layer is about 300 to 500 angstroms. Furthermore, the oxidation of the isolation oxide thick-layer simultaneously causes the diffusion of the heavily-doped base region to contact the lightly-doped base region.

BRIEF DESCRIPTION OF THE DRAWINGS

The present invention can be more fully understood by reference to the following description and accompanying drawings, which form an integral part of this application.

DETAILED DESCRIPTION OF THE PREFERRED EMBODIMENTS

Referring now to FIGS. 2(a) through 2(j), there are shown the processing steps for fabricating a vertical bipolar junction transistor (BJT) structure according to one preferred embodiment of the present invention. First, a silicon material having a first conductivity type is provided. The silicon material may be a P-type or N-type silicon substrate, a P-type or N-type well, or an epitaxy layer. In this embodiment, the silicon material is an N-type silicon substrate 2.

Figure 1:
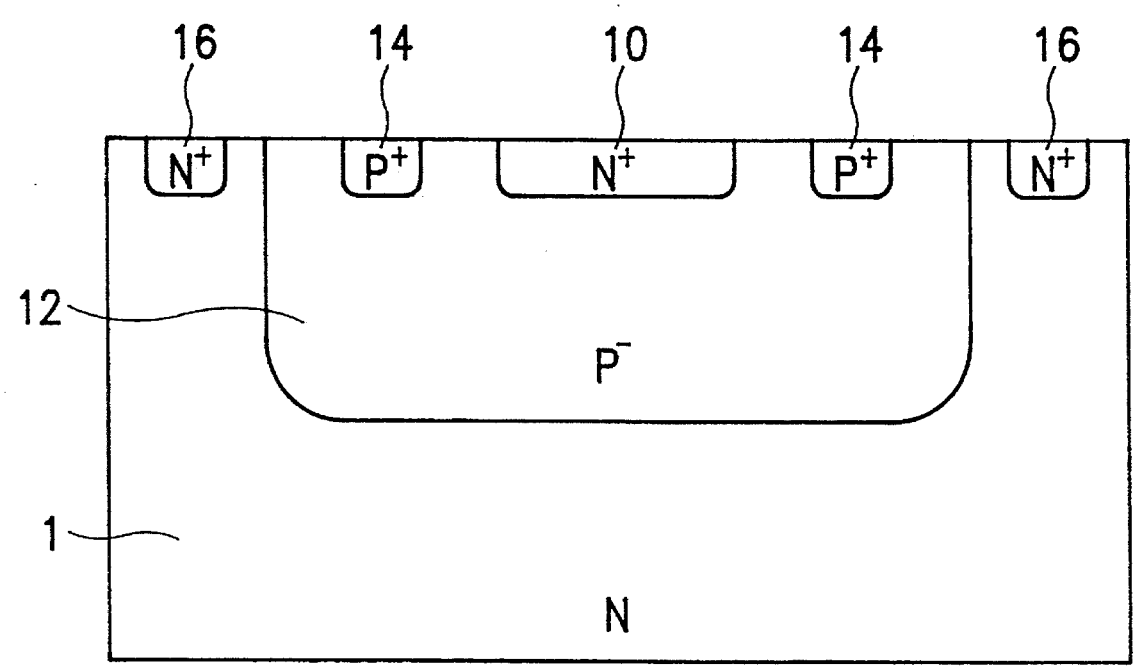
FIG. 1 (Prior Art) shows a schematic cross section of a conventional vertical bipolar junction transistor.
Figure 2A:
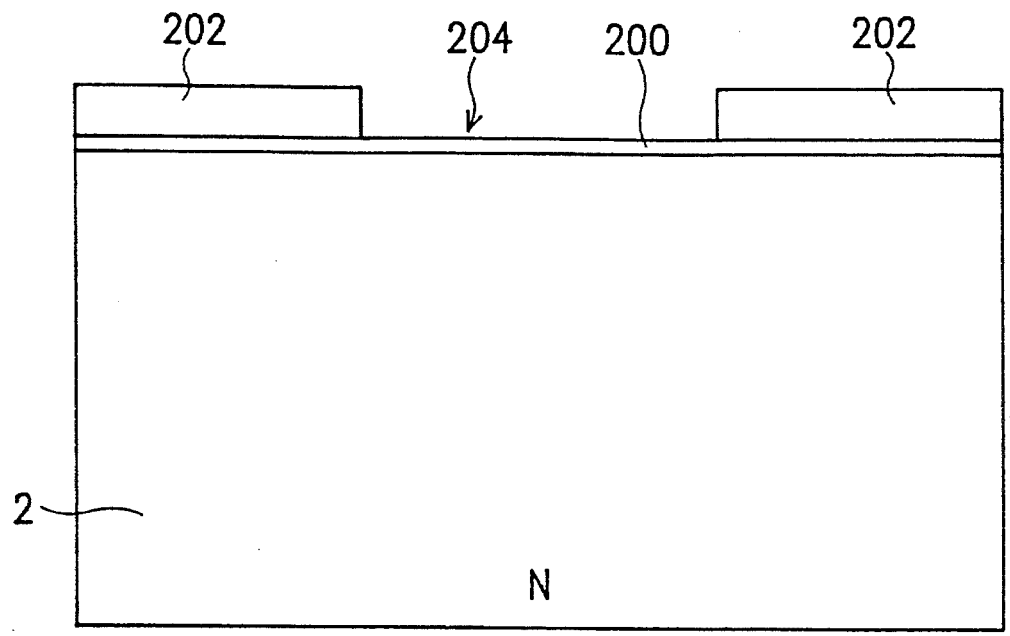
FIGS. 2(a) through 2(j) are schematic cross sections showing the processing steps for fabricating a vertical bipolar junction transistor according to one preferred embodiment of the present invention.

Referring to FIG. 2(a), a pad oxide 200 is formed on the silicon substrate 2 by thermal oxidation. In this embodiment, the thickness of the pad oxide 200 is about 3000~5000 angstroms. A shielding layer 202, for example, a silicon nitride layer, is deposited over the pad oxide 200, and is patterned to form an opening 204 by conventional photolithography and etching technologies.

Figure 2B:
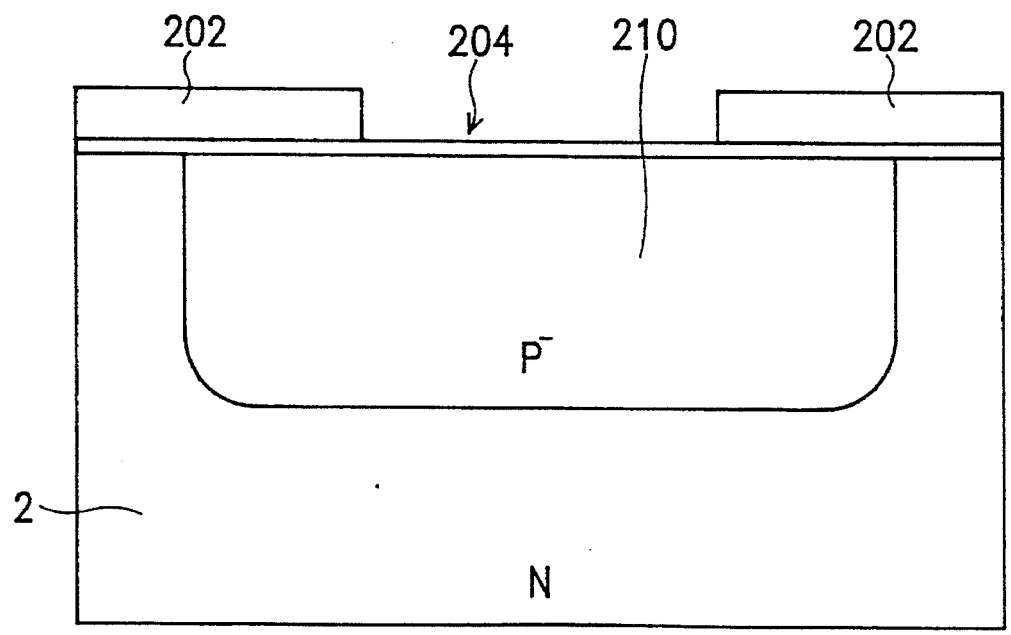

Referring to FIG. 2(b), a $P^-$-type dopant is then implanted into the silicon substrate 2 through the opening 204 by using the shielding layer 202 as a mask, and is driven in to form a lightly-doped $P^-$ base region 210 of the BJT. The base region 210 will laterally diffuse to the underside of the shielding layer 202. The dopant may be B or $BF_2$ ions.

Figure 2C:
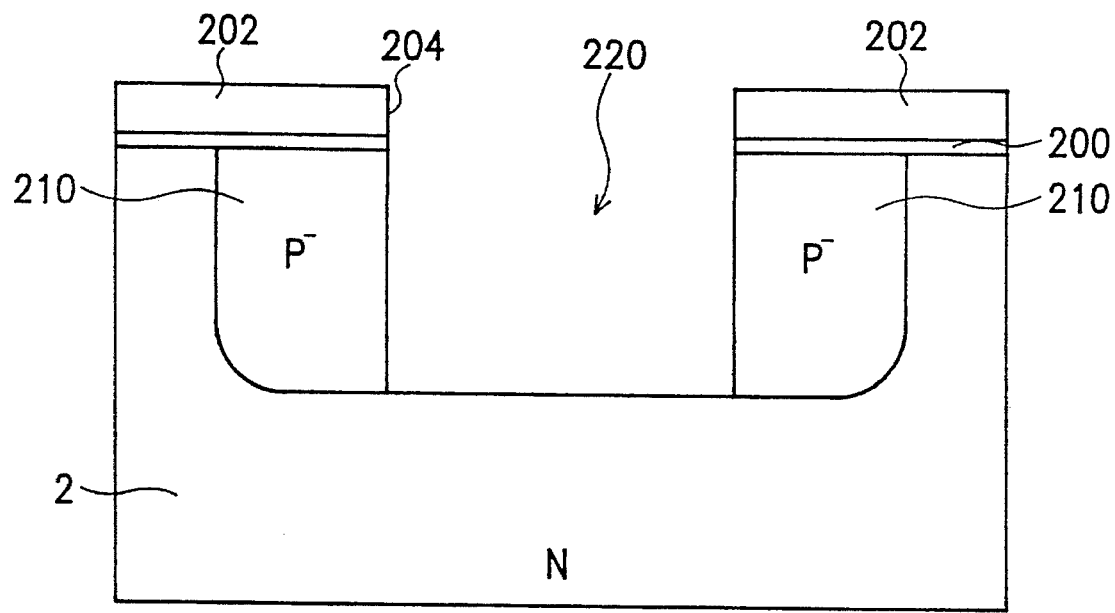

Referring to FIG. 2(c), the exposed pad oxide 200 is removed by etching, and then the exposed silicon substrate 2 is etched to form a trench 220. A reactive ion etching (RIE) procedure may be used to form the trench 220 by using the shielding layer 202 as a mask.

Figure 2D:
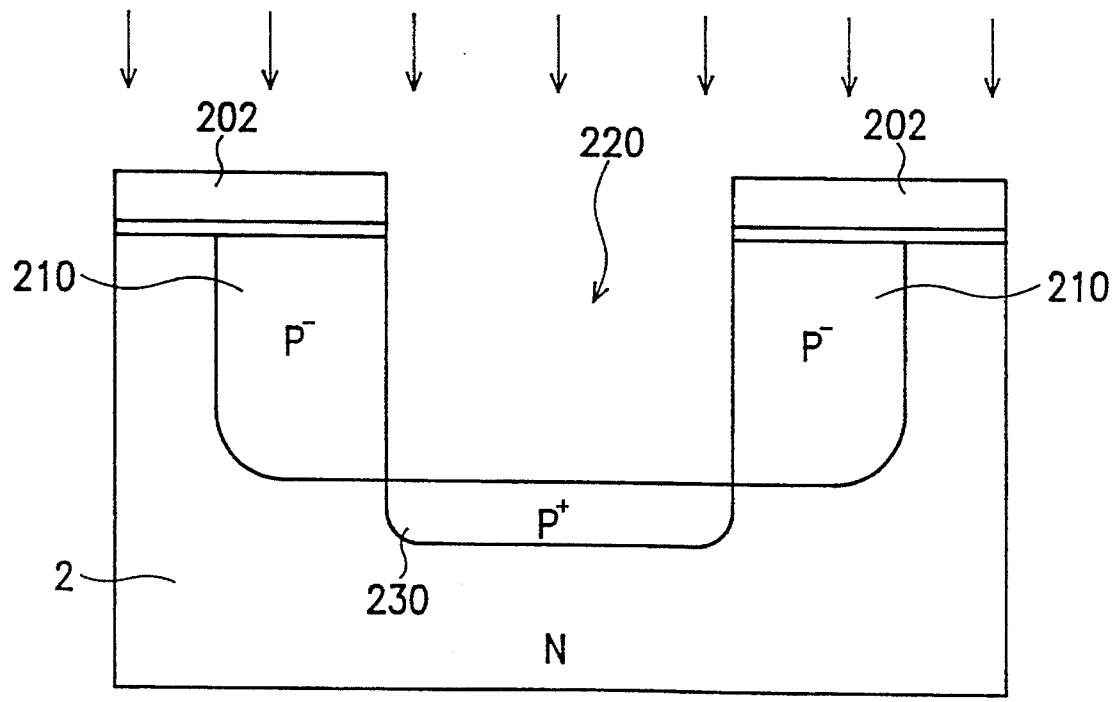

Referring to FIG. 2(d), a $P^+$-type dopant is further implanted into the silicon substrate 2 through the trench 220, by using the shielding layer 202 as a mask, to form a heavily-doped $P^+$ base region 230 under the bottom of the trench 220. The dopant may be B or $BF_2$ ions.

Figure 2E:
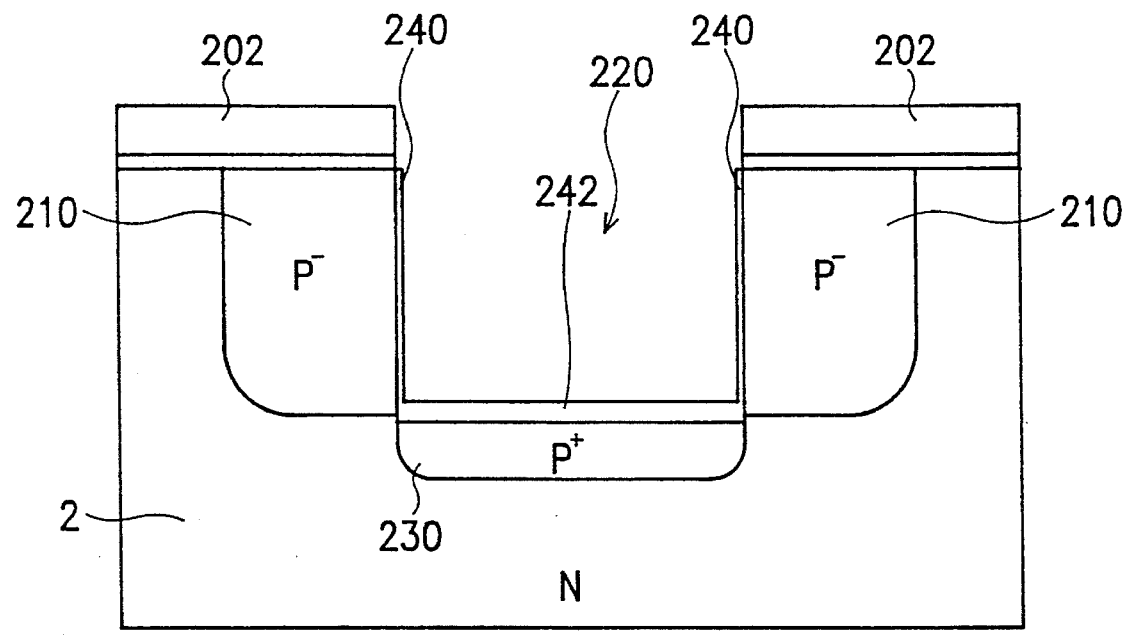

Referring to FIG. 2(e), a thin-layer thermal oxidation procedure is performed to form a first silicon oxide 240 at the sidewall of the trench 220, and a second silicon oxide 242 at the bottom of the trench 220. Since the $P^-$ base region 210 is lightly doped, and the $P^+$ base region 230 is heavily doped, the second silicon oxide 242 is thicker than the first silicon oxide 240. In this embodiment, the thickness of the first silicon oxide 240 is about 300~500 angstroms, and the thickness of the second silicon oxide 242 is about 600~1000 angstroms.

Figure 2F:
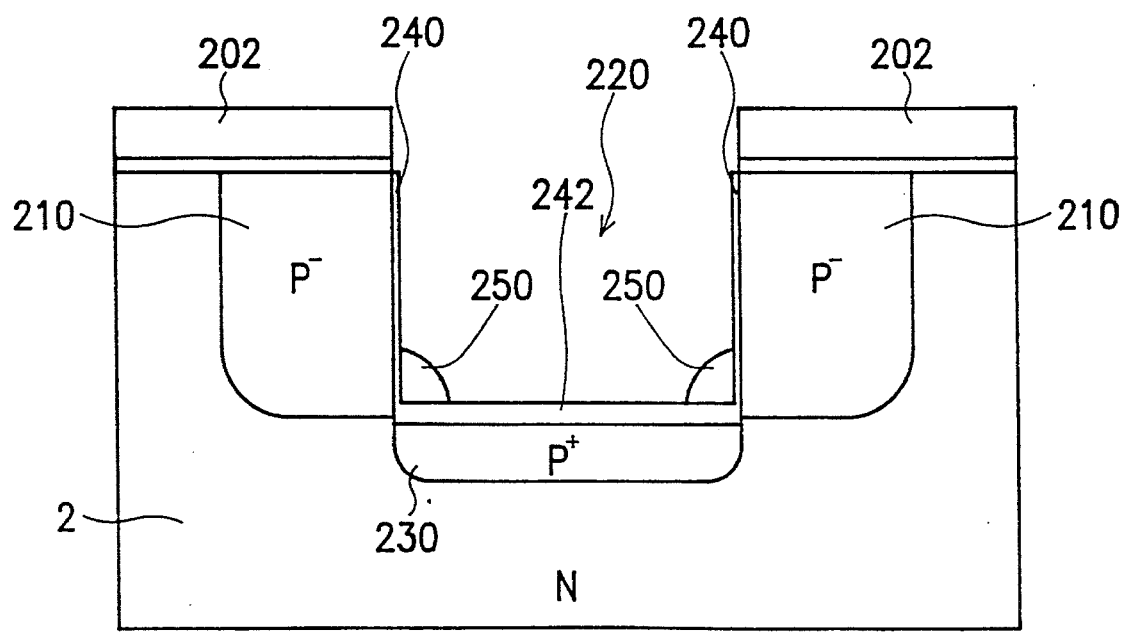

Referring to FIG. 2(f), a sidewall spacer 250 is formed at the lower corner of the trench 220. The sidewall spacer 250 may be made by depositing a silicon nitride layer and then etching back.

Figure 2G:
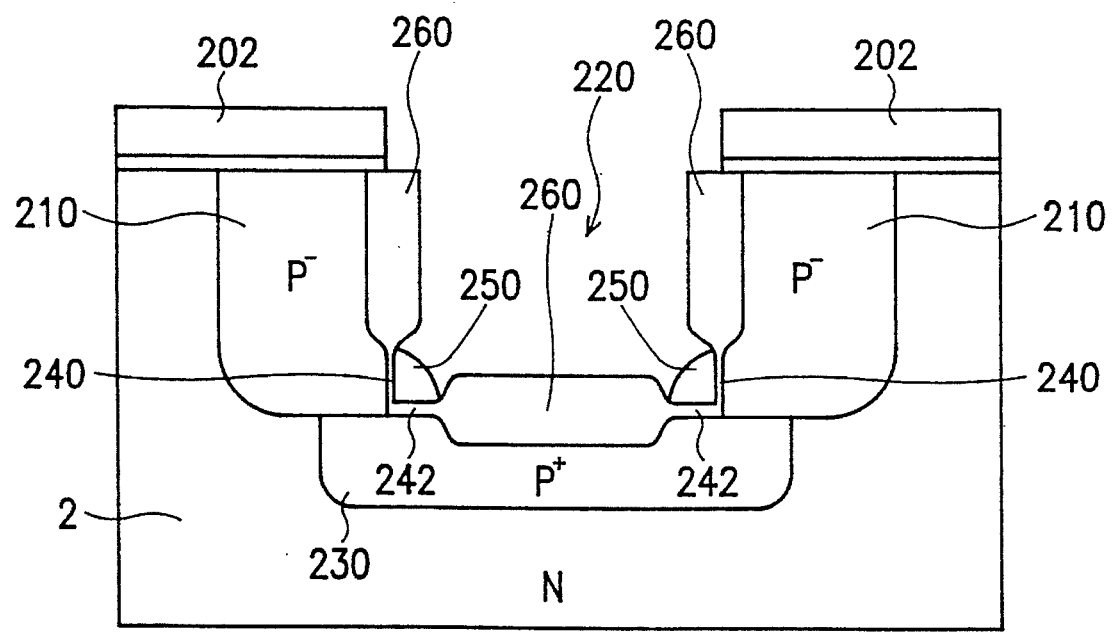

Referring to FIG. 2(g), a thermal oxidation procedure is further performed to form thicker isolation oxides 260 at the sidewall and bottom portions of the trench 220 which is uncovered by the sidewall spacer 250, by using the shielding layer 202 and the spacer 250 as masks. This thermal procedure will drive in the doped $P^{30}$ base region 230 to contact the $P^-$ base region 210 due to lateral diffusion.

Figure 2H:
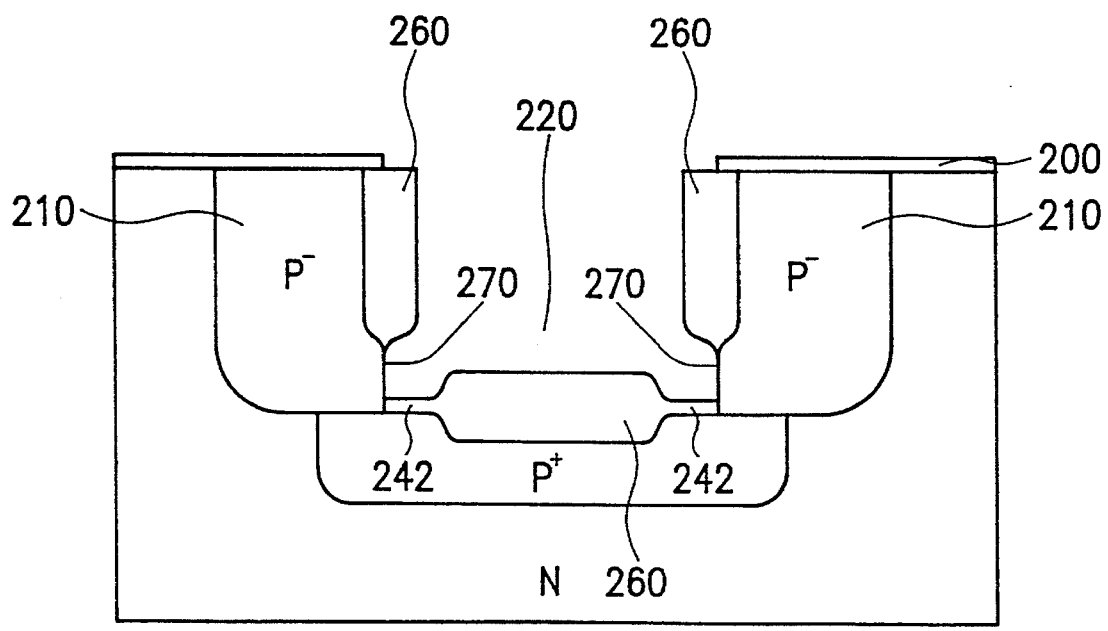

Referring to FIG. 2(h), the shielding layer 202 and the sidewall spacer 250 are removed by etching, and the exposed first silicon oxide 240 is then removed by etching to form a contact window 270 to the $P^-$ base region 210. Since the first silicon oxide 240 is thinner than the pad oxide 200, the second silicon oxide 242 and the isolation oxides 260, it can be etched away by wet etching.

Figure 2I:
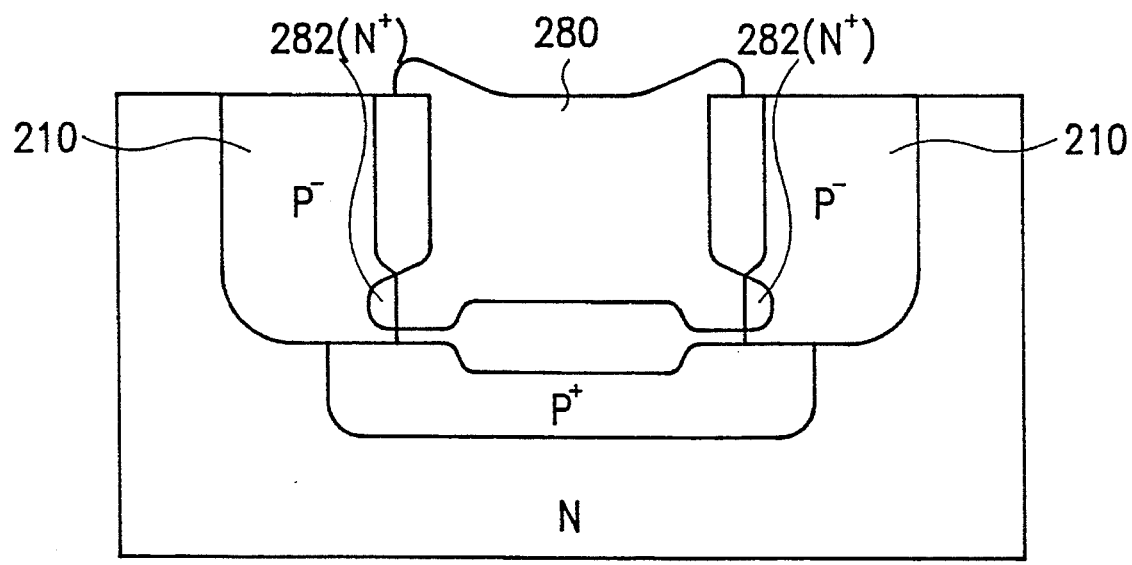

Referring to FIG. 2(i), a polysilicon layer is deposited over the entire surfaces, and is heavily doped by an $N^+$-type dopant, for example phosphorus (P) ions. The doping of the polysilicon layer causes an $N^+$diffused emitter region 282 into the $P^-$ base region 210 through the contact window 270 shown in FIG. 2(h). The polysilicon layer is then patterned to form a final polysilicon layer 280 in the trench 220, as shown in FIG. 2(i), by conventional photolithography and etching technologies. The pad oxide 200 is then removed by etching.

Figure 2J:
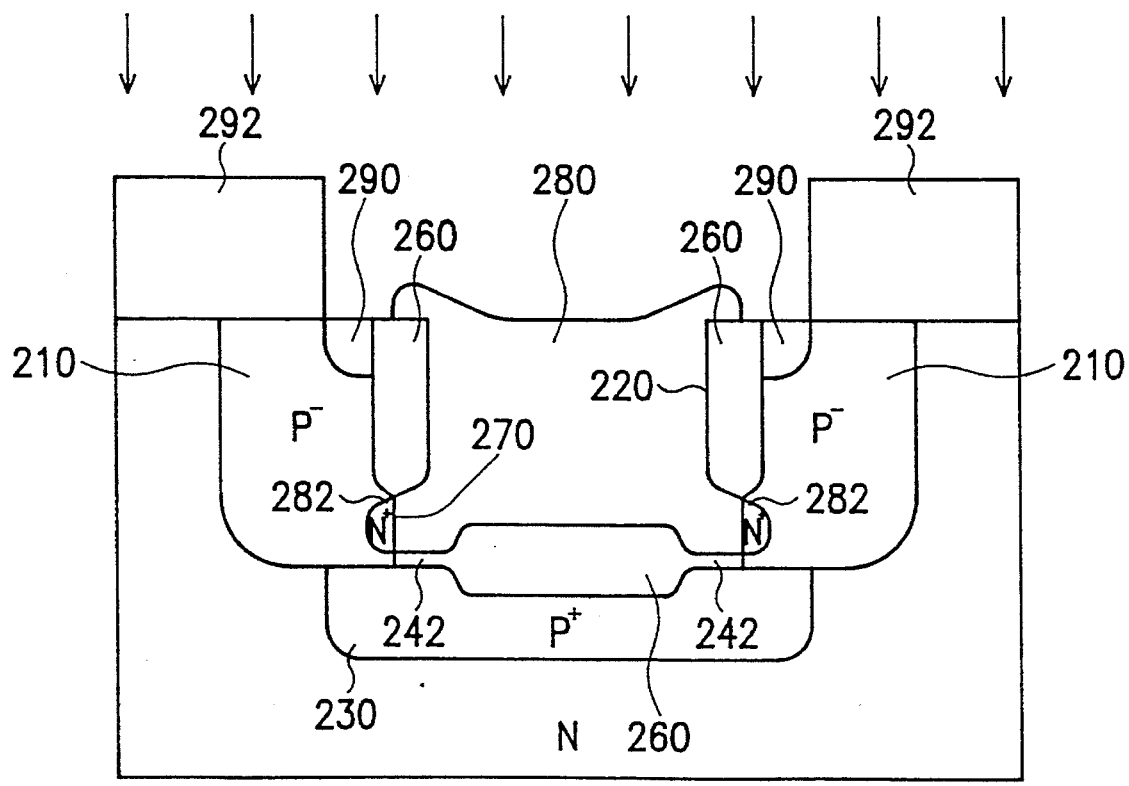

Referring to FIG. 2(j), a photoresist layer 292 is formed on the silicon substrate 2 to expose the designated collector region in the upper surface of the $P^-$ base region 210 near the trench 220. An $N^+$-type dopant, for example, phosphorus ions, is implanted and diffused into the $P^-$ base region 210 to form a collector region 290. Finally, the photoresist layer 292 is removed.

From the above-described process, the BJT structure of the present invention is fabricated, as shown in FIG. 2(j). The BJT comprises the N-type silicon substrate 2 provided with the trench 220, the $P^-$ base region 210 located in the silicon substrate 2 and adjacent to the sidewalls of the trench 220, the $P^+$ base region 230 located in the silicon substrate 2 and adjacent to the bottoms of the trench 220 and the $P^-$ base region 210, the $N^+$ emitter region 282 located in the $P^-$ base region 210 and near the lower corner of the trench 220, the $N^+$ collector region 290 located in the $P^-$ base region 210 and near the upper corner of the trench 220, and the conductive layer 280 located in the trench 220. In the trench 220, most upper portions of the sidewalls and the central portion of the bottom are provided with the thicker isolation oxides 260. The peripheral portions of the bottom of the trench 220 are provided with the thinner oxide 242. The contact window 270 is provided in the sidewalls of the trench 220, at the area which is near the lower corner of the trench 220, and is uncovered by the isolation oxide 260. The conductive layer 280 contacts the $N^+$ emitter region 282 through the contact window 270.

In this BJT structure of the present invention, since the emitter region 282 is formed by diffusion from the conductive layer 280, its area can be lowered to reduce the junction capacitance, leading to an increase in the switching speed. Furthermore, the distance from the emitter region 282 to the collector region 290 can be easily shortened by decreasing the depth of the trench 220. Therefore, the collector resistance can be easily reduced to raise the switching speed.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A process for fabricating a bipolar junction transistor comprising the following steps:

providing a silicon substrate of a first conductivity type;

forming, by deposition and etching, a shielding layer having an opening over said silicon substrate;

implanting ions of a second conductivity type opposite to said first conductivity type into said silicon substrate through said opening to form a lightly-doped base region extending to the underside of said shielding layer by diffusion;

etching said silicon substrate to form a trench by using said shielding layer as a mask;

implanting ions of said second conductivity type into said silicon substrate through said trench to form a heavily-doped base region located under the bottom of said trench and extending to contact said lightly-doped base region by diffusion;

forming, by oxidation, a first oxide thin-layer at the sidewalls of said trench, and a second oxide thin-layer at the bottom of said trench;

forming a sidewall spacer at the lower corner of said trench;

forming, by oxidation, an isolation oxide thick-layer at the surfaces uncovered by said shielding layer and said sidewall spacer;

removing said sidewall spacer, said shielding layer, and said first oxide thin-layer previously covered by said sidewall spacer in order to form a contact window in said trench;

forming, in said trench, a conductive layer heavily doped by a dopant of said first conductivity type, said dopant diffusing into said lightly-doped base region through said contact window to form an emitter region; and forming a collector region of said first conductivity type in the upper surface of said lightly-doped base region.

2. A process according to claim 1, wherein said conductive layer is made of polysilicon.

3. A process according to claim 1, wherein said first conductivity type is N type and said second conductivity type is P type.

4. A process according to claim 1, wherein said first conductivity type is P type and said second conductivity type is N type.

5. A process according to claim 1, wherein said shielding layer and said sidewall spacer are made of silicon nitride.

6. A process according to claim 1, wherein the thickness of said first oxide thin-layer is about 300 to 500 angstroms.

7. A process according to claim 1, wherein the oxidation of said isolation oxide thick-layer simultaneously causes the diffusion of said heavily-doped base region to contact said lightly-doped base region.

* * * * *